(12) United States Patent
Kurita et al.

(10) Patent No.: US 7,976,635 B2
(45) Date of Patent: *Jul. 12, 2011

(54) DUAL SUBSTRATE LOADLOCK PROCESS EQUIPMENT

(75) Inventors: Shinichi Kurita, San Jose, CA (US);
Wendell T. Blonigan, Union City, CA (US); Akihiro Hosokawa, Cupertino, CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/691,612

(22) Filed: Jan. 21, 2010

(65) Prior Publication Data
US 2010/0107672 A1 May 6, 2010

Related U.S. Application Data

(63) Continuation of application No. 11/613,556, filed on Dec. 20, 2006, now abandoned, which is a continuation of application No. 10/842,079, filed on May 10, 2004, now Pat. No. 7,641,434, which is a continuation of application No. 09/464,362, filed on Dec. 15, 1999, now Pat. No. 6,949,143.

(51) Int. Cl.
*H01L 21/677* (2006.01)
*H01L 23/34* (2006.01)
*F25D 23/12* (2006.01)

(52) U.S. Cl. .................. 118/724; 156/345.22; 62/259.2

(58) Field of Classification Search ................. 62/259.2; 118/724; 156/345.22
See application file for complete search history.

(56) References Cited

U.S. PATENT DOCUMENTS

| 5,512,320 | A | 4/1996 | Turner et al. |
| 5,716,207 | A | 2/1998 | Mishina et al. |
| 5,909,994 | A | 6/1999 | Blum et al. |
| 5,961,269 | A | 10/1999 | Kroeker |
| 6,042,623 | A | 3/2000 | Edwards |
| 6,059,507 | A | 5/2000 | Adams |
| 6,086,362 | A | 7/2000 | White et al. |
| 6,234,107 | B1 * | 5/2001 | Tanaka et al. ............ 118/723 R |
| 6,270,582 | B1 | 8/2001 | Rivkin et al. |
| 6,315,512 | B1 | 11/2001 | Tabrizi et al. |
| 6,338,626 | B1 | 1/2002 | Saeki |
| 6,357,143 | B2 | 3/2002 | Morad et al. |
| 6,375,746 | B1 | 4/2002 | Stevens et al. |

(Continued)

OTHER PUBLICATIONS

European Search Report dated Jun. 22, 2005 for European Patent Application No. 00311017.8.

(Continued)

*Primary Examiner* — Sylvia R. MacArthur
(74) *Attorney, Agent, or Firm* — Patterson & Sheridan, L.L.P.

(57) ABSTRACT

One embodiment relates to a loadlock having a first support structure therein to support one unprocessed substrate and a second support structure therein to support one processed substrate. The first support structure is located above the second support structure. The loadlock includes an elevator to control the vertical position of the support structures. The loadlock also includes a first aperture to permit insertion of an unprocessed substrate into the loadlock and removal of a processed substrate from the loadlock, as well as a second aperture to permit removal of an unprocessed substrate from the loadlock and insertion of a processed substrate into the loadlock. A cooling plate is also located in the loadlock. The cooling plate includes a surface adapted to support a processed substrate thereon. A heating device may be located in the loadlock above the first support structure.

13 Claims, 13 Drawing Sheets

U.S. PATENT DOCUMENTS

| | | |
|---|---|---|
| 6,431,807 B1 | 8/2002 | Stevens et al. |
| 6,477,787 B2 | 11/2002 | Morad et al. |
| 6,486,444 B1 | 11/2002 | Fairbairn et al. |
| 6,558,509 B2 | 5/2003 | Kraus et al. |
| 6,568,552 B1 | 5/2003 | Tabrizi et al. |
| 6,610,150 B1 | 8/2003 | Savage et al. |
| 6,647,665 B1 | 11/2003 | Tabrizi et al. |
| 6,688,375 B1 | 2/2004 | Turner et al. |
| 6,949,143 B1 | 9/2005 | Kurita et al. |
| 7,105,463 B2 * | 9/2006 | Kurita et al. ............ 438/782 |
| 7,207,766 B2 * | 4/2007 | Kurita et al. ............ 414/641 |
| 7,641,434 B2 * | 1/2010 | Kurita et al. ............ 414/217 |
| 2001/0041120 A1 | 11/2001 | Hofmeister |
| 2002/0005168 A1 | 1/2002 | Kraus et al. |
| 2002/0137346 A1 | 9/2002 | Donaldson et al. |
| 2007/0086881 A1 | 4/2007 | Kurita et al. |
| 2010/0107672 A1 * | 5/2010 | Kurita et al. ............ 62/259.2 |

OTHER PUBLICATIONS

Singapore Search Report dated Jun. 25, 2002 for Singapore Patent Application No. SG 200007457.5.

First Office Action dated Jun. 17, 2008 for Japanese Patent Application No. 2000-382319.

Office Action dated Aug. 27, 2006 for Korean Patent Application No. 10-2000-76959.

Prosecution History for U.S. Appl. No. 11/613,556, dated Dec. 26, 2006.

* cited by examiner

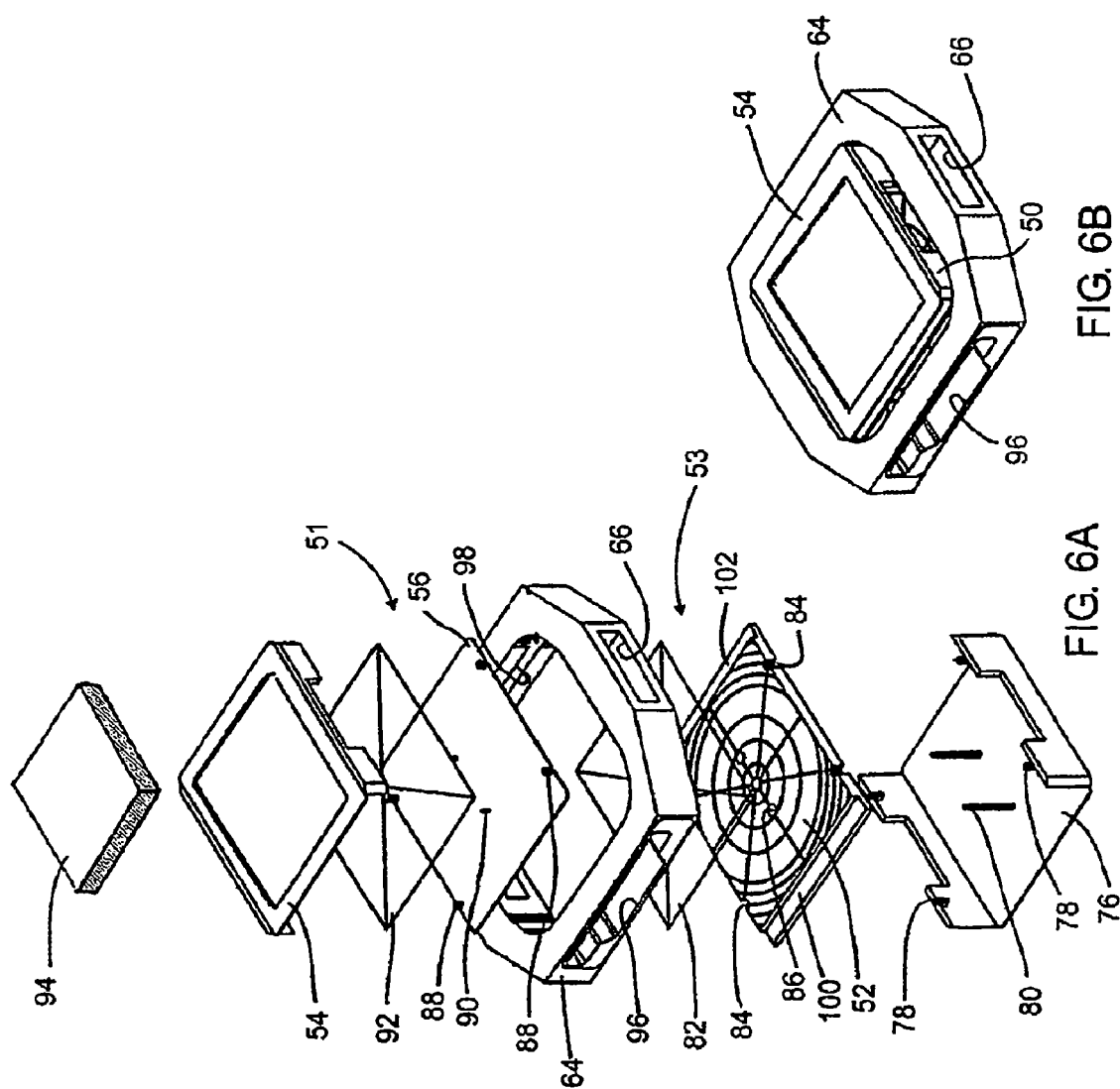

DUAL SUBSTRATE LOADLOCK PROCESS EQUIPMENT

CROSS-REFERENCE TO RELATED APPLICATION

This application is a continuation of U.S. patent application Ser. No. 11/613,556, filed Dec. 20, 2006 now abandoned, which is a continuation of U.S. patent application Ser. No. 10/842,079, filed May 10, 2004 and issued as U.S. Pat. No. 7,641,434, which is a continuation of U.S. patent application Ser. No. 09/464,362, filed Dec. 15, 1999 and issued as U.S. Pat. No. 6,949,143, all of which are herein incorporated by reference in their entireties.

FIELD OF THE INVENTION

The present invention relates to substrate processing systems, and, more particularly, to loadlock systems for handling substrates.

BACKGROUND OF THE INVENTION

Substrates such as, for example, glass panels used in applications such as television and computer displays may be fabricated using sequential steps including physical vapor deposition (PVD), chemical vapor deposition (CVD), etching, and annealing to produce the desired device. These steps may be carried out using a variety of processing systems having multiple chambers. One such system is known as a "cluster tool". A cluster tool generally includes a central wafer handling module or transfer chamber and a number of peripheral chambers including a loadlock chamber through which workpieces are introduced into and removed from the system and a plurality of other chambers for carrying out processing steps such as heating, etching, and deposition. The cluster tool also generally includes a robot for transferring workpieces between the chambers.

The processing of large glass substrates used for displays is in some ways similar to the processing of other types of substrates such as semiconductor wafers. Such glass substrates, however, are often larger than typical silicon wafers. For example, glass substrates may have dimensions of 550 mm by 650 mm, with trends towards even larger sizes such as 650 mm by 830 mm and larger, to permit the formation of larger displays. The use of large glass substrates introduces complexities into processing that may not be present when processing other types of substrates. For example, in addition to their size, glass substrates used for displays are typically rectangular in shape. The large size and shape of glass substrates can make them difficult to transfer from position to position within a processing system when compared with smaller, circular-shaped substrates. As a result, systems for processing glass substrates generally require larger chambers, apertures, and transfer mechanisms. In addition, it is known to utilize large cassettes holding approximately 12 substrates within the loadlock in order to supply a large number of substrates to the processing chambers for batch processing operations. The need for larger chamber sizes to handle large substrates, as well as the use of large substrate cassettes in the loadlock, also leads to a requirement for larger and more powerful vacuum pumps, power supplies, control mechanisms and the like and a corresponding increase in system cost.

In addition, glass substrates often have different thermal properties than silicon substrates. In particular, glass generally has a relatively low thermal conductivity, which can make it more difficult to uniformly heat and cool the substrate. Temperature gradients may occur across the glass substrate, which can lead to undesirable stresses in the substrate upon cooling. The heat loss near the substrate edges tends to be greater than near the center. Temperature gradients during processing can also result in the components formed on the substrate surface having non-uniform electrical (and structural) characteristics. As a result, to maintain adequate temperature control, heating and cooling operations are often performed relatively slowly. As the system components become larger in size, these steps may be slowed even more due to the longer time it generally takes to heat and cool large components in a large volume chamber. These slow operations tend to lower the system throughput.

SUMMARY OF THE PREFERRED EMBODIMENTS

Certain embodiments of the present invention relate to loadlock devices for use in substrate processing systems that are relatively compact in size and that can achieve substrate transfer, cooling and/or heating operations in an efficient manner.

In one embodiment, a loadlock chamber comprises a chamber body having a first and second substrate access port, a first plurality of support pins movably disposed in the chamber body and arranged to support a first substrate thereon, a second plurality of support pins movably disposed in the chamber body and arranged to support a second substrate thereon, and a cooling plate disposed in the chamber body below the first plurality of support pins and stationary with respect to the chamber body.

In another embodiment, a loadlock chamber comprises a chamber body having a first and a second substrate access port, a first plurality of support pins movably disposed in the chamber body and arranged to support a first substrate thereon, a second plurality of support pins movably disposed in the chamber body and arranged to support a second substrate thereon, and a cooling plate fixed to the chamber body at a position below the first plurality of support pins.

BRIEF DESCRIPTION OF THE DRAWINGS

Embodiments of the invention are described with reference to the accompanying drawings which, for illustrative purposes, are schematic and not drawn to scale.

FIG. 6A is an exploded view of certain interior components of a loadlock according to an embodiment of the present invention.

FIG. 6B is a perspective view of some of the loadlock components of FIG. 6 when assembled together according to an embodiment of the present invention.

DETAILED DESCRIPTION

Figure 1:
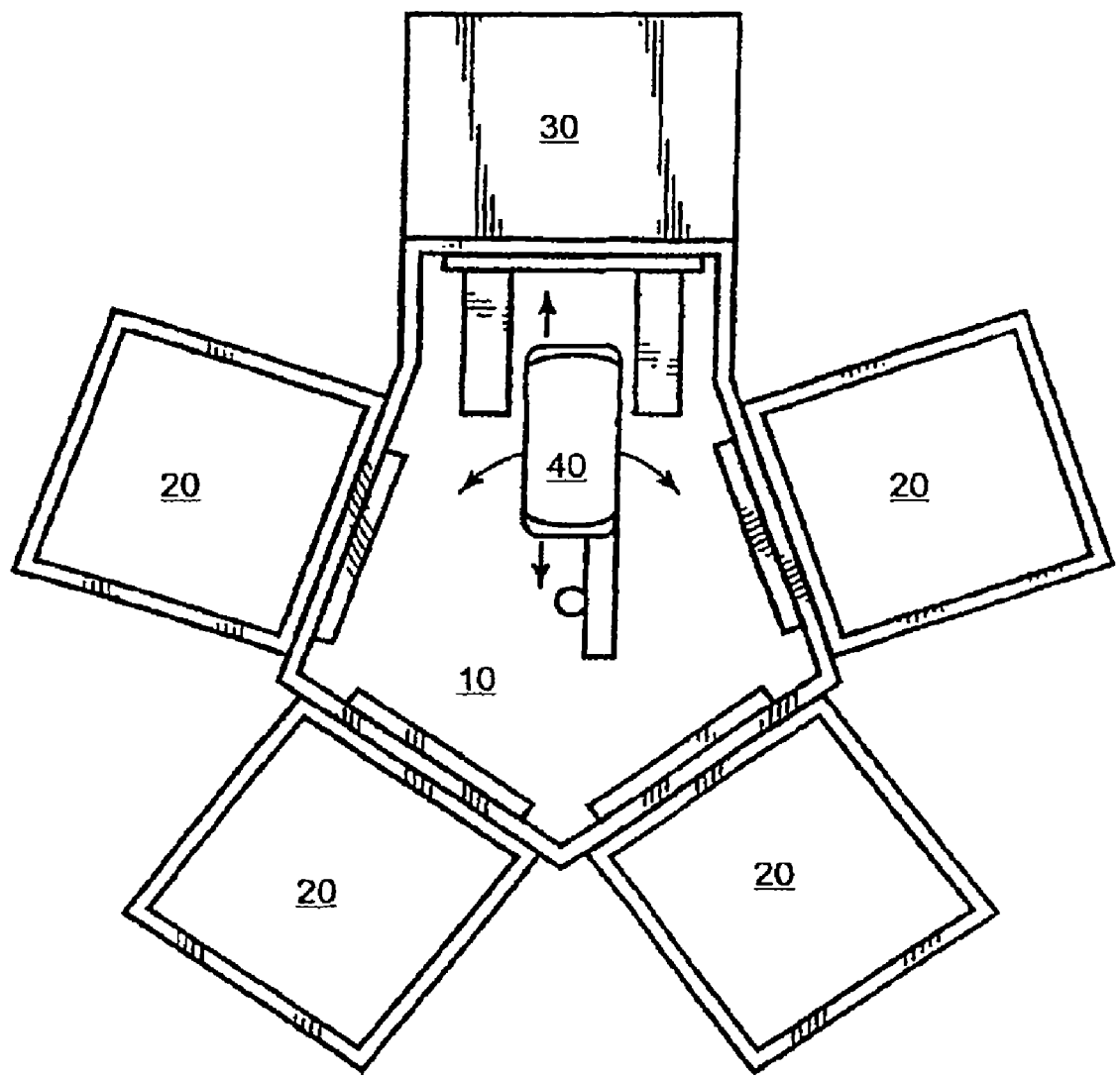
FIG. 1 is a top schematic view of a cluster tool including a loadlock, transfer chamber, and processing chambers according to an embodiment of the present invention.

Certain preferred embodiments relate to loadlock systems and methods of operation. These loadlock systems may be used as part of a larger cluster type processing system. As illustrated in FIG. 1, one embodiment includes a cluster system having a central substrate handling module or transfer chamber 10, a number of peripheral process chambers 20, and at least one loadlock mechanism 30 for inserting substrates into the system and removing substrates from the system. The central transfer chamber 10 may include a robot 40 therein for picking up and delivering substrates between the various chambers. The term substrates includes substrates formed from a variety of materials including, but not limited to glasses, semiconductors, ceramics, metals, composites, and combinations thereof.

Figure 2:
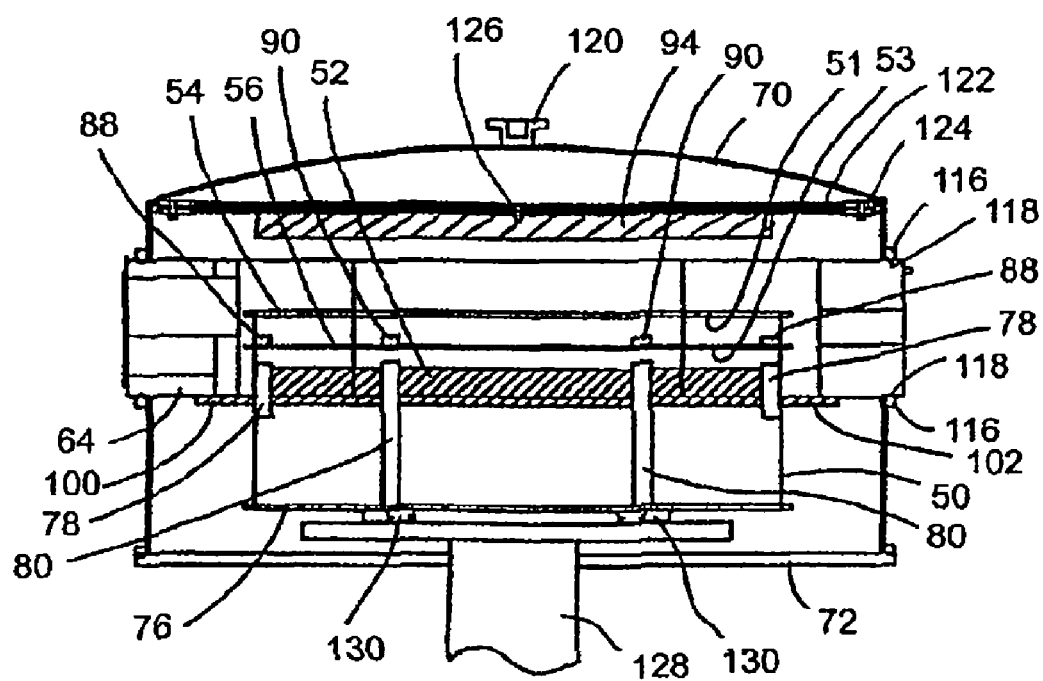
FIG. 2 is a cross-sectional view of a portion of the loadlock of FIG. 1 in accordance with an embodiment of the present invention.

A preferred embodiment of the loadlock 30 is illustrated in the cross-sectional view of FIG. 2. The loadlock 30 preferably includes a dual substrate cassette 50, with an upper slot 51 for holding an unprocessed substrate and a lower slot 53 for holding a processed substrate. The upper slot 51 may preferably be located between an upper plate 54 and a middle plate 56 of the cassette 50. The lower slot 53 may preferably be formed between the middle plate 56 and a cooling plate 52, above a lower plate 76 of the cassette 50. The plates 54, 56 and 76 are assembled to form the cassette 50. The cooling plate 52 is almost entirely located within the cassette 50. However, it is preferably not connected to the cassette 50. Instead, flange portions 100, 102 of the cooling plate 52 are preferably attached to a frame member 64 that surrounds the cassette 50. This structure enables the cassette 50 to move independently of the cooling plate 52 by coupling the cassette to an elevator 58 (FIG. 3) through shaft 128. By moving the cassette 50 independently of the cooling plate 52, a substrate on supports 78, 80 within the lower slot 53 can be lowered onto and raised off of the cooling plate 52 by moving the cassette.

In certain preferred embodiments, a substrate on the cooling plate 52 may be cooled by positioning the cooling plate (with the substrate thereon) and the middle plate 56 very close to one another. By sandwiching the substrate between the cooling plate 52 and middle plate 56, the substrate can be cooled in an efficient manner. As will be discussed in more detail later, both the middle plate 56 and the cooling plate 52 may be water cooled and may have a high emissivity surface area.

Figure 3:
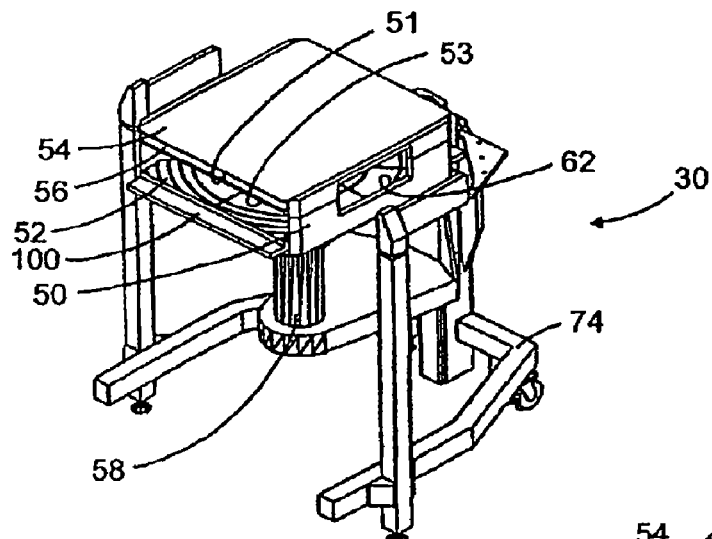
FIG. 3 is a perspective view of a loadlock according to an embodiment of the present invention.
Figure 4:
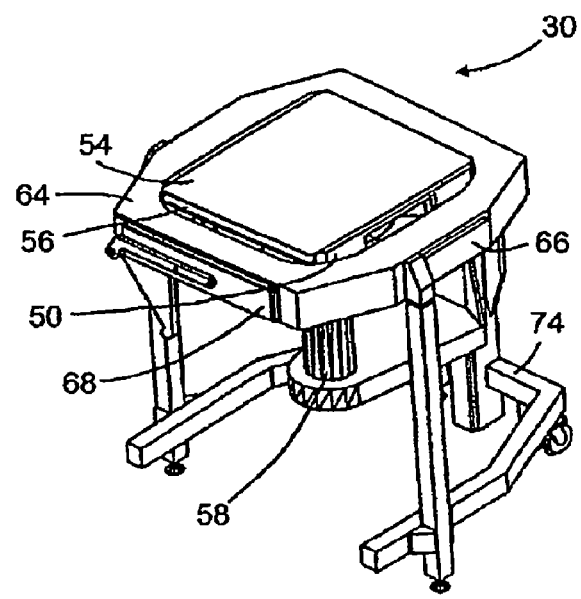
FIG. 4 is a perspective view of the loadlock of FIG. 3 including an outer body section around an interior compartment according to an embodiment of the present invention.
Figure 5:
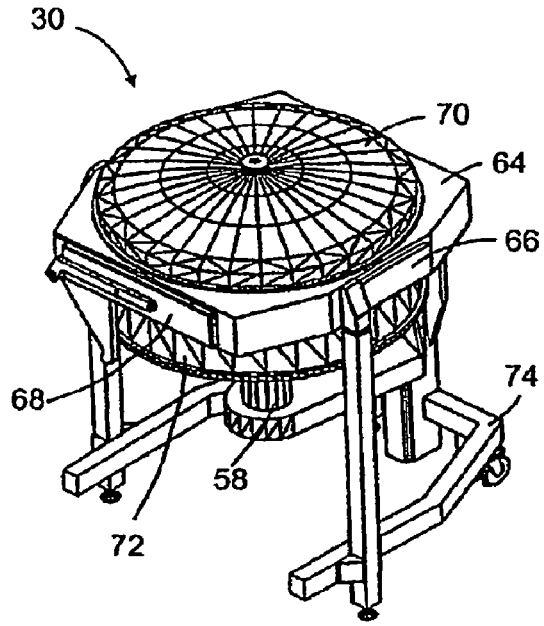
FIG. 5 is a perspective view of the loadlock of FIGS. 3 and 4 including a cover portion and a lower portion according to an embodiment of the present invention.

Progressive views of the loadlock 30 are illustrated in FIGS. 3-5. The cassette 50 may include an opening 62 for viewing the cassette interior during operation. FIG. 4 shows the loadlock 30 of FIG. 3, further including the loadlock body portion or frame member 64 surrounding the cassette 50. A window 66 may be provided for viewing the interior of the cassette through opening 62, and a door 68 may be provided for accessing the interior of the loadlock to insert and remove substrates. The elevator 58 may be positioned below the cassette 50 and used to move the cassette 50 relative to the cooling plate 52 and frame member 64. As shown in FIG. 2, the elevator 58 may include a shaft 128 attached to the bottom of the cassette 50 through a connection such one or more connectors 130 and plate 132. The connectors 130 may be designed to be adjustable so that the cassette 50 can be leveled if it becomes misaligned. Alternatively, the shaft 128 may be directly connected to the cassette 50.

FIG. 5 shows the loadlock 30 of FIGS. 3 and 4, further including a top pressure vessel portion or top cover 70 and a lower pressure vessel portion or bottom cover 72 to define the loadlock chamber region. The top cover 70 and bottom cover 72 may be any suitable structure capable of maintaining appropriate vacuum or other desired pressure conditions and be capable of surviving elevated temperatures such as those encountered during substrate heating. The loadlock 30 may also include a wheeled frame structure 74 for supporting and moving the loadlock 30.

FIG. 6a illustrates an exploded view of certain components in the loadlock 30 including components from the cassette 50, the cooling plate 52 and the frame member 64. FIG. 6b illustrates the cassette 50 assembled within the frame member 64. The frame member 64 includes openings 96 and 98 on opposite sides, through which substrates are inserted into and removed from the loadlock. Opening 96 may be on the atmospheric side of the loadlock, and opening 98 may be on the transfer chamber side of the loadlock.

The lower plate 76 of the cassette 50 preferably has a support structure including the supports 78, 80 thereon for supporting a substrate 82. The cooling plate 52, (located above the lower plate 76) may include apertures 84, 86 through which the supports 78, 80 may extend to support the substrate 82 in the lower slot 53. The middle plate 56 preferably has a support structure including supports 88, 90 thereon for supporting a substrate 92 in the upper slot 51. Above the middle plate 56 (and the substrate 92) lies the upper plate 54 and heating device 94. The heating device 94 may include, for example, a resistance element or a heating lamp. Alternative embodiments may omit the upper plate 54 and/or the heating device 94.

As illustrated in FIG. 6a, the heating device 94 may fit into a recess in the upper plate 54 so that it moves with the cassette 50 and is always positioned close to the upper support structure. Alternatively, the heating device 94 may be positioned above the upper plate 54 as illustrated in FIG. 2 or at some other position in the loadlock. One preferred use for the heating device is to preheat an unprocessed substrate prior to transferring the substrate to other chambers. Preheating the substrate may free up one or more processing chamber positions in the system which would otherwise be used as heating chambers to heat the unprocessed substrate. By preheating the substrate in the loadlock, such heating chambers may be eliminated. Embodiments may heat the substrate to a desired temperature depending on the particular processing operation such as, for example, a temperature in the range of approximately 100 degrees Celsius to 500 degrees Celsius or higher. It may be possible to also use the loadlock for other types of heating operations, such as annealing or ashing, if desired. For certain types of high temperature processing or processing in which the substrate is heated in between other processing steps, separate heating chambers may still be required.

FIGS. 7a-f schematically illustrate several components of a loadlock as used during one possible processing embodiment. Certain component sizes and shapes have been altered relative to earlier figures for illustrative purposes. The components illustrated include the lower plate 76, the cooling plate 52, and the middle plate 56. Lower supports 78, 80 are coupled to the lower plate and upper supports 88, 90 are coupled to the middle plate 56. The lower plate 76 and middle plate 56 are coupled to one another to form cassette 50 as indicated by the dashed lines. The lower supports 78, 80 extend through apertures in the cooling plate 52. An atmospheric robot (not shown in FIGS. 7a-f) delivers into and removes substrates from the load lock through atmospheric opening 96 and door 68, and a transfer chamber robot (not shown in FIGS. 7a-f) removes from and delivers substrates into the loadlock through vacuum opening 98 and door 99. As seen in FIGS. 7a-f, the cooling plate 52 is coupled to the frame 64 and does not move relative to the openings 96, 98. The cassette 50 (which includes the lower plate 76, lower supports 78, 80, the middle plate 56, and the upper supports 88, 90), is moveable relative to the openings 96, 98.

Figure 7A:
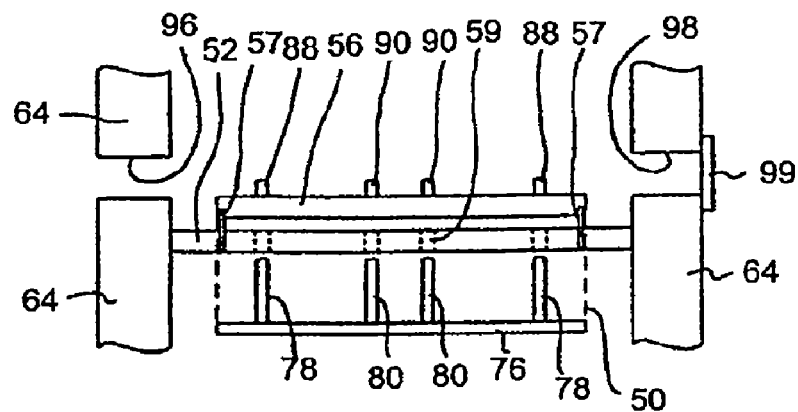
FIGS. 7A-F illustrate a processing scheme in accordance with an embodiment of the present invention.
Figure 7B:
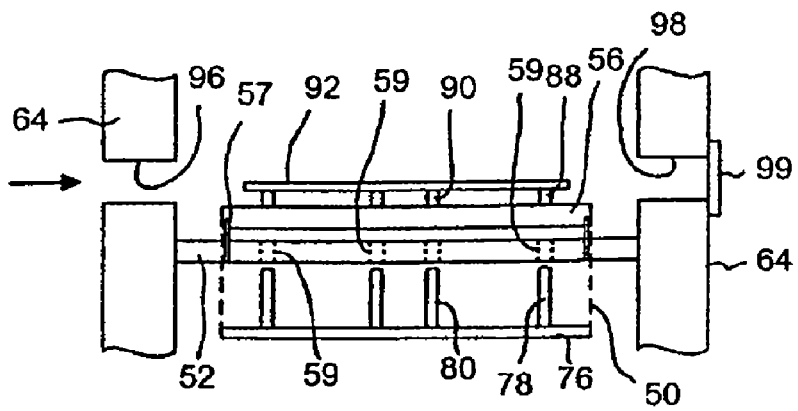
Figure 7C:
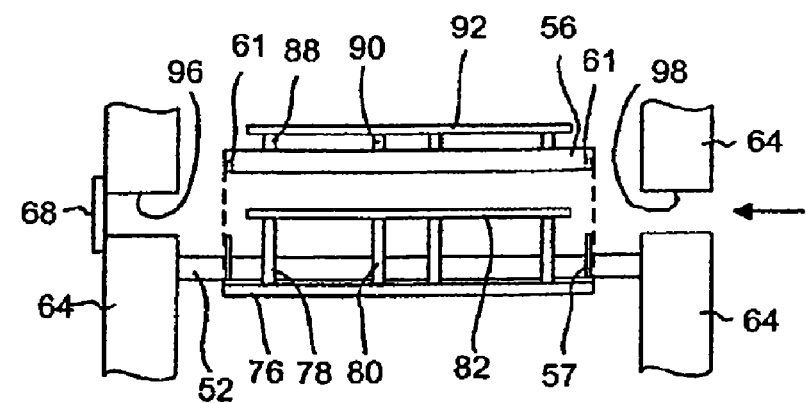

A condition when there are no substrates in the loadlock is illustrated in FIG. 7a. This may be the condition at the beginning of a processing cycle. In one embodiment, a processing method includes supplying an unprocessed substrate 92 to the loadlock. As shown in FIG. 7b, upper supports 88, 90 are aligned with the opening 96 and an unprocessed substrate 92 has been inserted into the loadlock through an atmospheric opening from the direction indicated by the arrow. Next, the atmospheric opening door 68 is closed, the loadlock is evacuated and the cassette 50 is raised to place the lower supports 78, 80 through openings 59 in the cooling plate 52 and into alignment with the vacuum opening 98 as shown in FIG. 7c. Vacuum opening door 99 is opened so that a processed substrate 82 can be delivered from a transfer (or other processing) chamber (not shown) to the loadlock from the direction shown by the arrow, and placed on supports 78, 80.

Figure 7D:
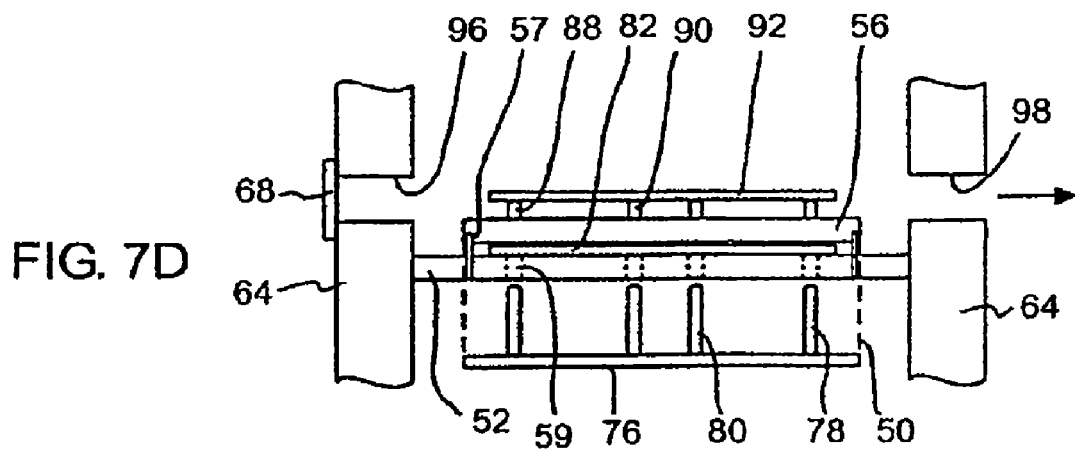

The cassette 50 may then be lowered to place the processed substrate 82 onto the cooling plate 52 for cooling, as shown in FIG. 7d. Preferred embodiments may include structures such as pins 57 extending from the cooling plate 52 into openings 61 in the bottom of the middle plate 56. The pins 57 may act to ensure proper alignment of the cooling plate 52 and middle plate 56 as well as providing a barrier to prevent a substrate from sliding off of the cooling plate in a lateral direction, which may occur due to a gas pressure introduced in the chamber during a cooling procedure. As can be seen in FIG. 7d, the cooling plate 52 and middle plate 56 may be positioned so that the processed substrate 82 is essentially sandwiched between the plates. This promotes the efficient cooling of the processed substrate 82. In general, the closer the middle plate 56 is positioned to the processed substrate 82, the faster the cooling rate of the processed substrate 82. In one example, a 5 mm gap between the middle plate 56 and the processed substrate 82 provided a cooling rate that was about 5 times faster than a 1 inch (~25 mm) gap.

Figure 7E:
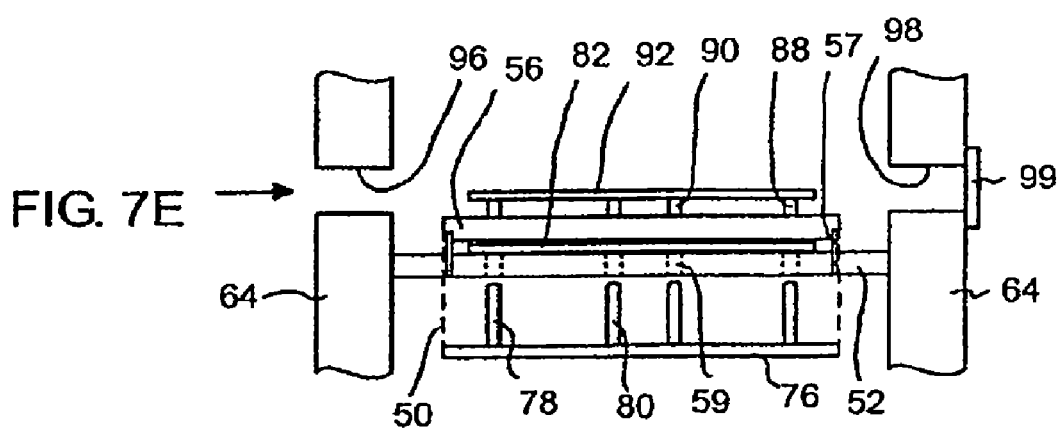
Figure 7F:
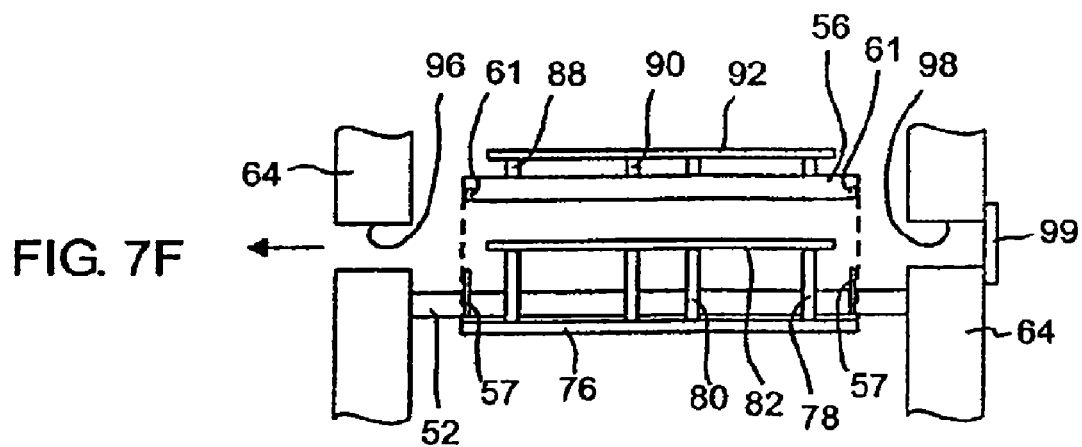

FIG. 7d also shows that the unprocessed substrate 92 has also been placed into alignment for delivery through the vacuum opening 98 in the direction indicated by the arrow. The unprocessed substrate is delivered through the vacuum opening and then the vacuum door 99 is closed and the chamber vented so that another unprocessed substrate 92' may be placed onto the upper support 88, 90 through the atmospheric opening, from the direction indicated by the arrow, as illustrated in FIG. 7e. The venting may also be controlled to promote uniform cooling of the processed substrate 82. The cassette 50 may then be raised to lift the processed substrate off of the cooling plate 52 and into position to be removed from the loadlock through the atmospheric opening 96 in the direction indicated by the arrow, as shown in FIG. 7f.

It should be appreciated that the above steps may be varied as desired and that there are numerous different processing schemes that may be performed according to embodiments of the present invention. For example, another processing embodiment may include heating the unprocessed substrate 92 in the loadlock prior to transferring it to the transfer chamber. In such an embodiment the heating step is carried out and the heated, unprocessed substrate 92 is preferably delivered through the vacuum opening 98 to the transfer chamber prior to delivering the processed substrate 82 from the transfer chamber to the loadlock.

Figure 8:
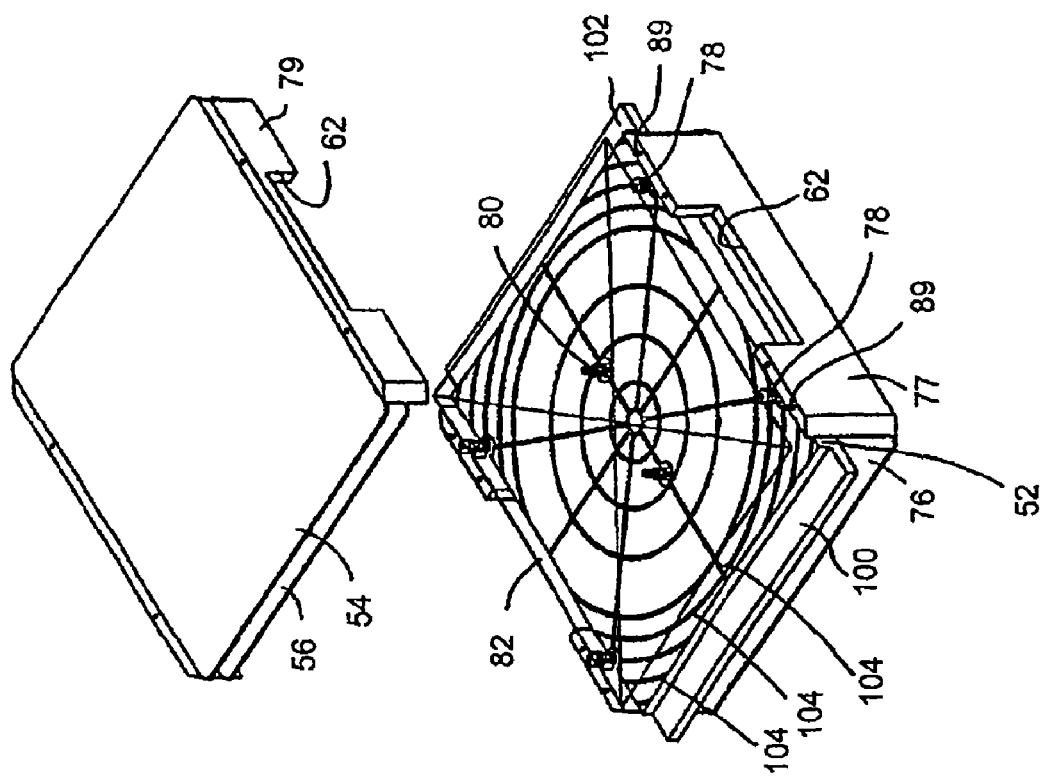
FIG. 8 is a perspective view of a portion of a loadlock system in a load/unload condition in accordance with an embodiment of the present invention.
Figure 9:
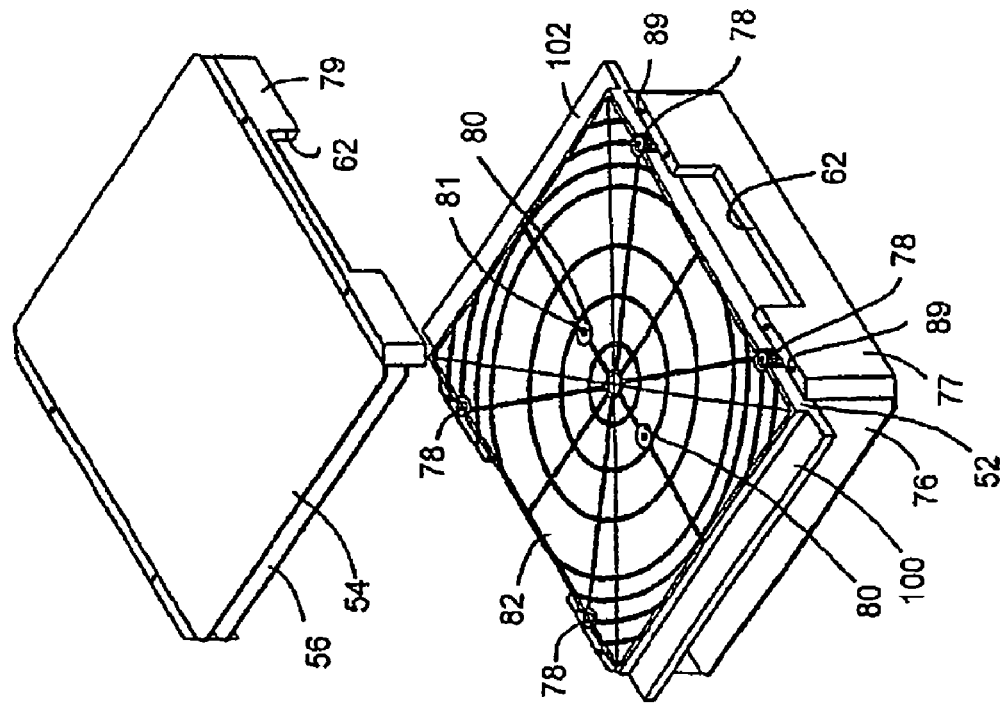
FIG. 9 is a perspective view of a portion of a loadlock system in a cool down condition in accordance with an embodiment of the present invention.

More detailed views of the cassette 50 and the cooling plate 52 are illustrated in FIGS. 8 and 9. The upper plate 54, middle plate 56, and lower plate 76 may be coupled together through side portions 77, 79. The side portions 77, 79 may be separate pieces coupled together using pins 89. Alternatively, the side portions 77, 79 may be a single unit and may be integrated into one or more of the plates 54, 56 and 76.

As seen in FIG. 8, the lower supports 78, 80 are supporting processed substrate 82 above the surface of the cooling plate 52. This configuration may correspond to a load/unload condition where a processed substrate 82 is being loaded into or removed from the loadlock. In this embodiment the processed substrate 82 is transparent. The supports 78, 80 may have a variety of structures that can support a substrate including, but not limited to a pin, bolt, screw or peg-like shape. The tips of the supports may also have variety of structures. For example, as illustrated in FIG. 7a, the tip of the supports 78, 80, 88, 90 are rounded, whereas in FIG. 9, the tips of the supports 78, 80 are flat and include openings 81. As illustrated in FIGS. 8 and 9, one embodiment preferably includes four outer pins 78 and two central pins 80.

FIG. 9 illustrates the position of the lower supports 78, 80 after the supports have been lowered to place the processed substrate 82 on the surface of the cooling plate 52. The cooling plate 52 may be designed to have one or more zones for preferentially controlling the temperature of a substrate thereon. This may be accomplished by providing a pattern of one or more channels or grooves 104 on its upper surface. The location and number of grooves 104 is designed to control the contact area between a substrate and the surface of the cooling plate 52 to permit better temperature control during cooling. For example, if more grooves 104 per unit area are located near the periphery of the cooling plate 52 than near the center, an increased surface area of the substrate will contact the cooling plate 52 near its center. If the center is a heat transmissive material such as, for example, a metal, then more heat will be transmitted from the center of the substrate. The grooves 104 are designed to counter the thermal losses, which typically occur more quickly near the periphery of the substrate. This leads to a more uniform temperature distribution across the substrate during cooling. In one embodiment the grooves 104 may have a width of about 6 mm and a depth of about 1 mm. Other dimensions may be suitable for particular applications.

Figure 10:
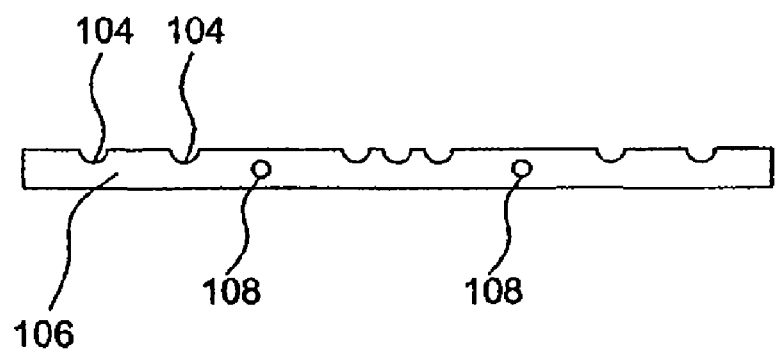
FIG. 10 is a cross-sectional view of a cooling plate with a coolant carrying channel therein in accordance with an embodiment of the present invention.
Figure 11:
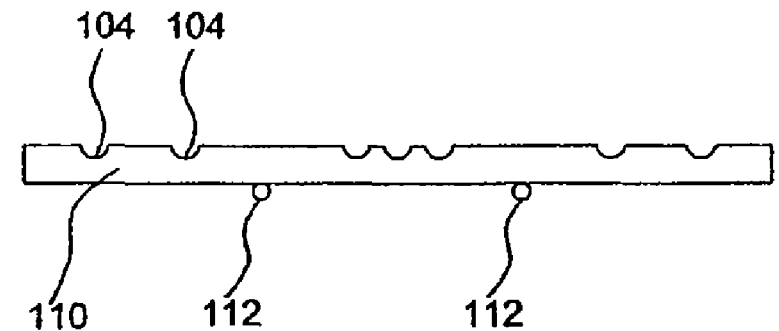
FIG. 11 is a cross-sectional view of a cooling plate with a coolant-carrying channel at a bottom portion of the cooling plate in accordance with an embodiment of the present invention.
Figure 12:
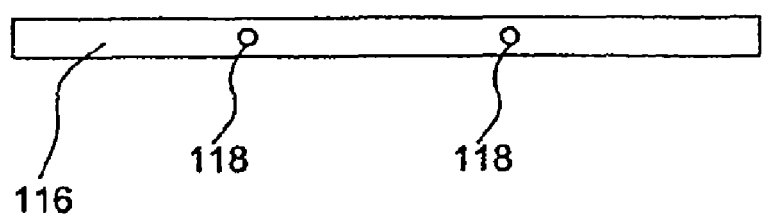
FIG. 12 is a cross-sectional view of a middle plate with a coolant carrying channel therein in accordance with an embodiment of the present invention.
Figure 13:
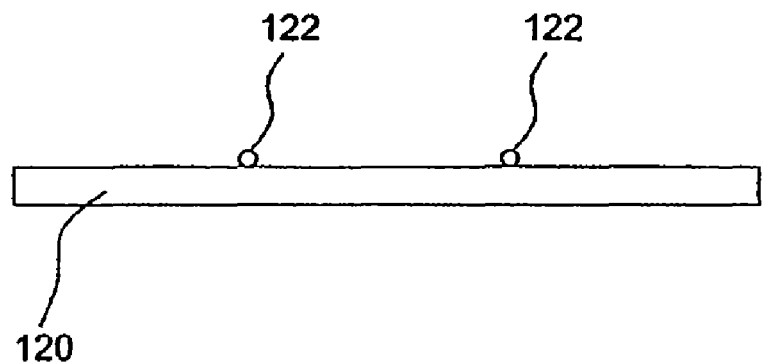
FIG. 13 is a cross-sectional view of a middle plate with a coolant carrying channel at an upper portion of the middle plate in accordance with an embodiment of the present invention.

Embodiments may also include a one or more coolant carrying channels incorporated into or attached to portions of a cooling plate and a middle plate in order to remove heat from the plate quickly. The coolant carrying channels may be distributed along the cooling plate as desired to yield different cooling characteristics for different portions of the cooling plate, in order to provide a more uniform temperature distribution across a substrate. FIG. 10 illustrates a cross-sectional view of an embodiment of a cooling plate 106 including a number of grooves 104 and a coolant carrying channel 108 formed therein. FIG. 11 illustrates an embodiment of a cooling plate 110 including grooves 104 and a pipe or tube 112 as a coolant carrying channel connected (permanently or detachably) to the bottom of the cooling plate 110. In certain embodiments, the middle plate acts like a second cooling plate to assist in cooling a processed substrate. FIG. 12 illustrates an embodiment of a middle plate 116 including a coolant carrying channel 118 therein. FIG. 13 illustrates an embodiment of a middle plate 120 having a pipe or tube 122 as a cooling carrying channel connected (permanently or detachably) to the top of the middle plate 120.

Figure 14:
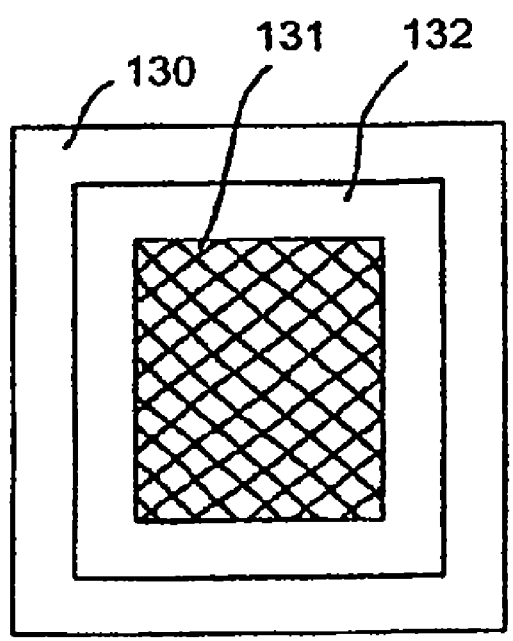
FIG. 14 is a top view of a plate having a high emissivity area in accordance with an embodiment of the present invention.

Embodiments may also include a cooling plate and a middle plate each including a surface having multiple characteristics such as a different surface finish in different locations. For example, a dull and/or black finish (or other dark color finish) may accelerate cooling due to greater heat absorption than a reflective and/or smooth finish, which will reflect more heat back to the substrate. Anodizing or bead blasting all or part of the cooling plate can form a preferred high emissivity finish that may accelerate cooling. As illustrated in FIG. 14, for example, the surface of a plate 130 (such as a cooling plate and/or a middle plate) may contain a high emissivity central area 131. As seen in FIG. 14, the high emissivity central area 131 of the plate 130 is viewed through a transparent substrate 132. The substrate 132 preferably has a larger size than the high emissivity area 131 (and a smaller size than the plate 130). In certain embodiments, in order to more uniformly cool the substrate it is desirable to not provide the high emissivity region 130 near the edges of the substrate 132. This is because the edges of the substrate 132 tend to cool more quickly than its center area, so providing the high emissivity region 130 over the entire surface would lead to the edges of the substrate 132 cooling much faster than the central area. Such non-uniform cooling can cause undesirable stresses and/or warping of the substrate 132.

The top and bottom covers 70, 72 (FIG. 2) of the loadlock 30 may include flanges 116 and o-rings 118, which are used to mount the top cover 70 and lower cover 72 to the loadlock frame member 64. Top cover 70 may also include inlet/outlet vent 120, which may include a gas delivery pipe or tube through which a gas may be delivered to the interior of the loadlock. A variety of gases may be delivered to the loadlock depending on the processing operation (cooling, annealing, preheating, ashing, etc.) to be carried out. In certain embodiments, it is preferred that a cooling gas is delivered into the chamber upon venting to assist in cooling a processed substrate on the cooling plate 52. Preferred cooling gases for use in the chamber include nitrogen and/or helium. Other inert gases including, but not limited to argon and neon could also be used. Certain embodiments utilize a mixture of helium and nitrogen at pressures of about 754-759 Torr nitrogen and about 1-6 Torr helium. In one preferred embodiment, cooling gas is supplied to the chamber by venting the chamber at 3 Torr helium and 757 Torr nitrogen. This cooling scheme has been observed to provide a uniform and rapid cooling. Preferred embodiments may also include helium alone as the cooling gas due to its inert nature and thermal conductivity. It is preferred that the substrate be cooled with a uniformity of about 100 degrees Celsius or less along the substrate, even more preferably about 50 degrees Celsius or less. If desired a filter 122 (FIG. 2) may be positioned near the top of the loadlock to filter out undesirable particles and to promote uniform distribution of gas throughout the loadlock chamber. The filter 122 may be held in place by holder 124 and may be adjusted using screw 126.

Figure 15:
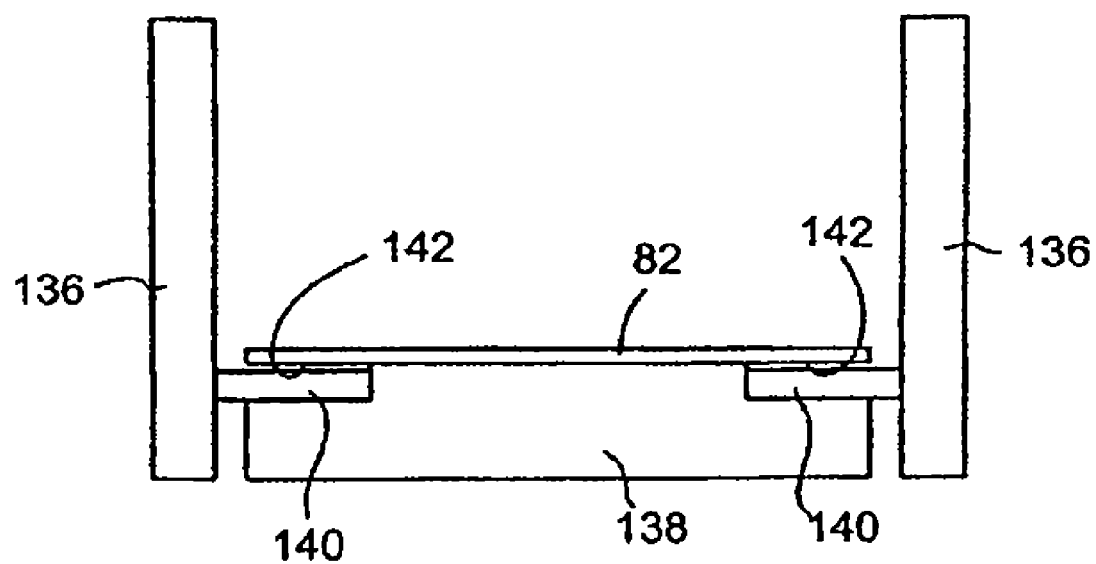
FIG. 15 is a cross-sectional view of a cooling plate and substrate support system according to an embodiment of the present invention.

In certain preferred embodiments, the lower supports 78, 80 extend through apertures in the cooling plate 52. Alternative embodiments may utilize a lower support extending adjacent to the cooling plate instead of through the apertures in the cooling plate. As illustrated in FIG. 15, one such embodiment may include a support 136 adjacent to a cooling plate 138 including one or more movable arms 140 which may be lowered into one or more grooves 142 in the cooling plate 138 in order to deposit a processed substrate 82 on the upper surface of the cooling plate 138.

Other embodiments may include a loadlock having components similar in some ways to those illustrated in 6a, but including a single opening for transferring substrates in and out of the loadlock and between the loadlock and a transfer chamber.

Figure 16:
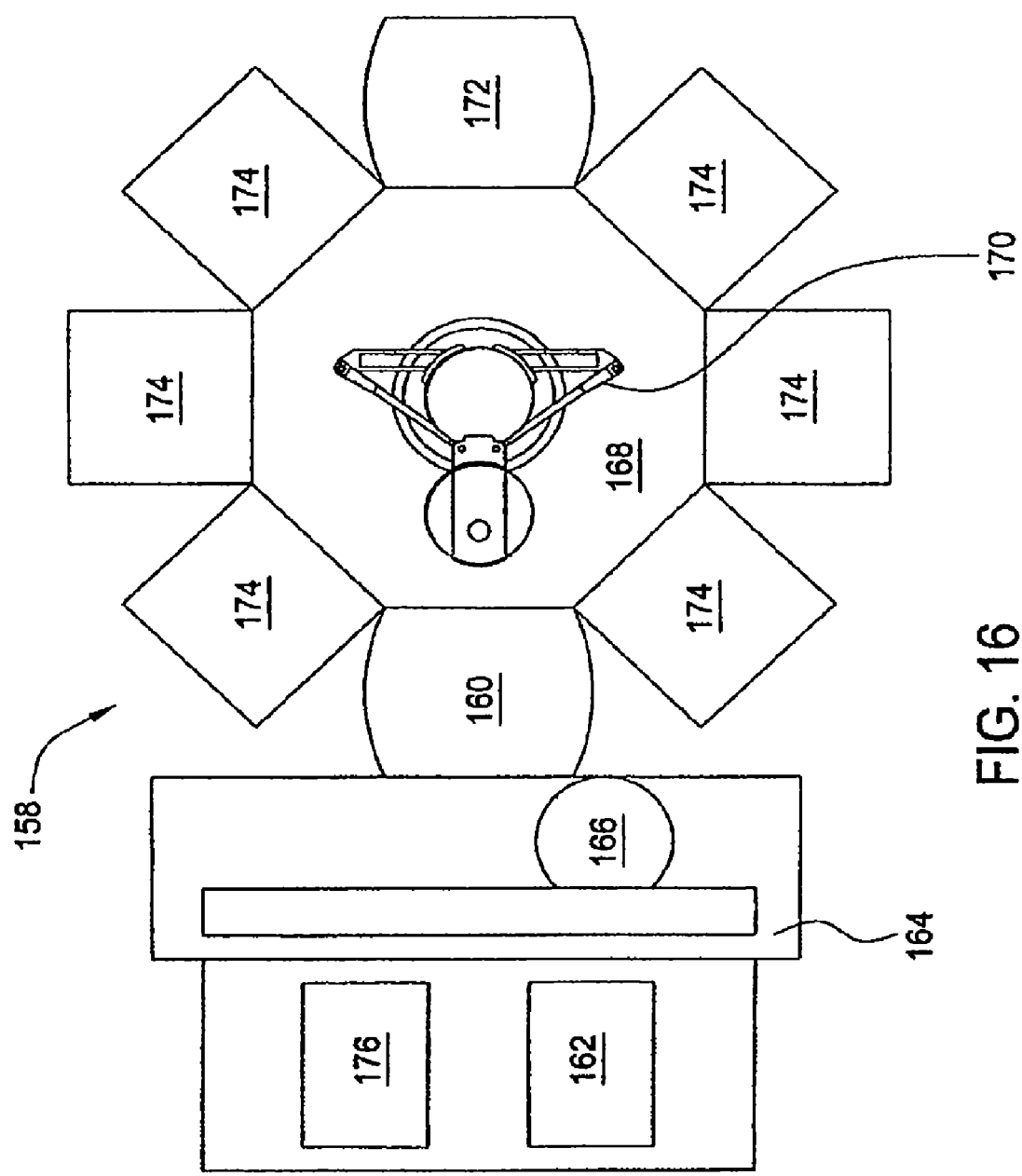
FIG. 16 is a top cross-sectional view of a cluster chamber according to an embodiment of the present invention.
Figure 17:
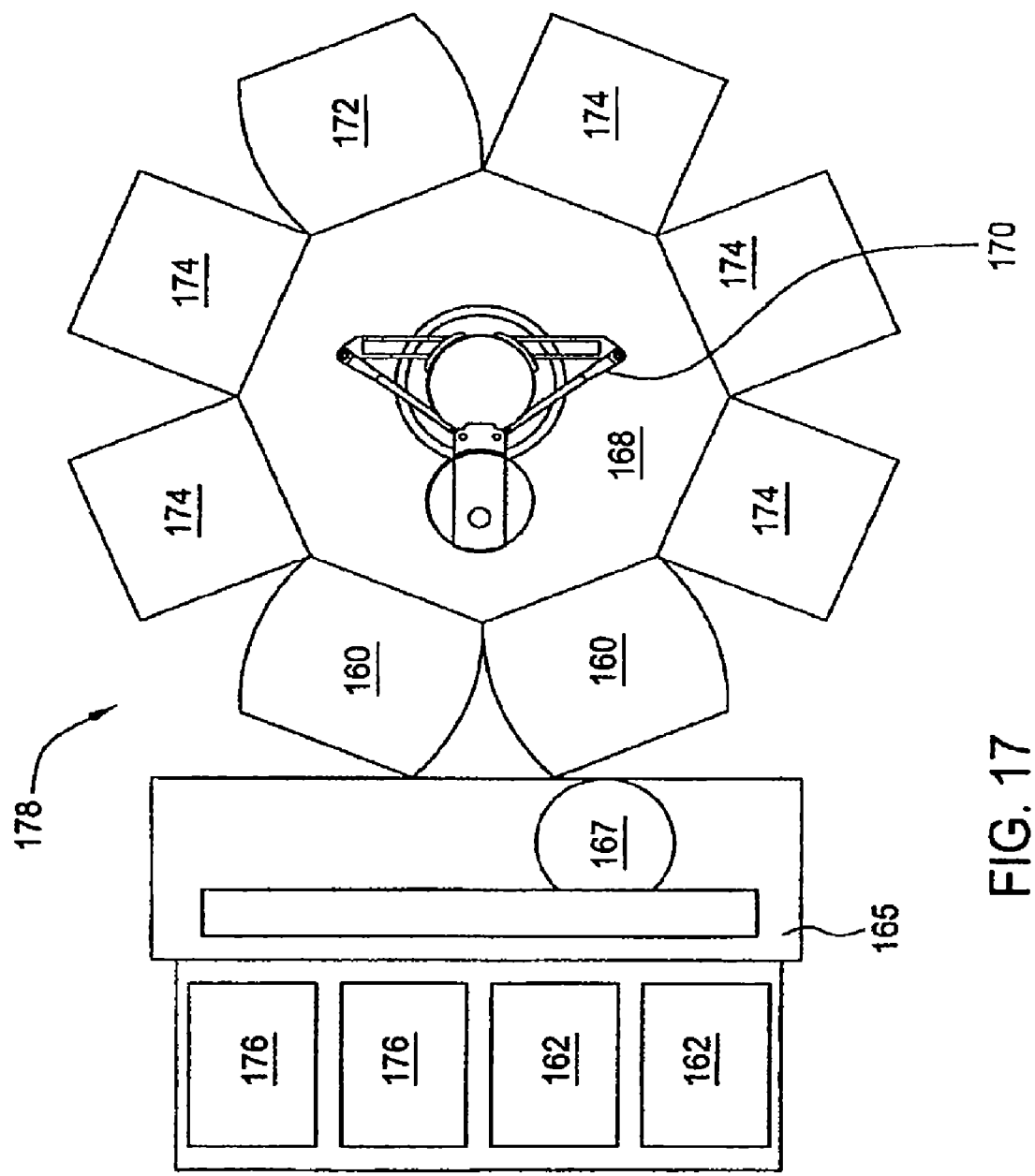
FIG. 17 is a top cross-sectional view of a cluster chamber according to an embodiment of the present invention.

Several embodiments of cluster processing systems according to embodiments of the present invention are illustrated in FIGS. 16 and 17. FIG. 16 illustrates a system 158 which, according to one embodiment, includes a supply of unprocessed substrates from an unprocessed substrate cassette 162, which may be supplied to the loadlock 160 from a substrate cassette and robot station 164 one at a time using a robot 166. The loadlock 160 may have a similar structure to the loadlock 30 shown in FIGS. 2-4 Once an unprocessed substrate is inside the loadlock 160, the loadlock 160 is evacuated and the unprocessed substrate is transported to the transfer chamber 168 having a second robot 170 therein. Once inside the transfer chamber 168, the unprocessed substrate is transferred between chambers for processing. In one embodiment, the substrate is first transported to chamber 172 for heating, then back to the transfer chamber 168, and then to another processing chamber 174, which may be any other type of processing chamber such as, for example, a chemical vapor deposition (CVD) chamber, a physical vapor deposition (PVD) chamber, or an etching chamber. After treatment in a processing chamber 174, the substrate may be transported to the transfer chamber 168 and then to another processing chamber 174. When the substrate is fully processed as desired, it is then delivered from the final processing chamber to the transfer chamber 168 and back to the loadlock 160. The processed substrate may then be cooled in the loadlock 160. Cooling may take place while the loadlock 160 is evacuated and may also take place as the loadlock 160 is vented. Once venting is complete and the processed substrate is sufficiently cooled (such as, for example, to about 100 degrees Celsius), the processed substrate may be removed from the loadlock 160 using the robot 166 and delivered to a processed substrate cassette 176 at the station 164.

Another embodiment of a processing system 178 in some ways similar to that of FIG. 16 is illustrated in FIG. 17. However, the embodiment of FIG. 17 includes two loadlocks 160 and five processing chambers 174, as well as one heating chamber 172 and transfer chamber 168 having a robot 170 therein. This embodiment may be particularly useful when the processing can be carried out quickly and throughput can be increased by supplying more substrates to the system. As illustrated, the system 178 includes a larger station 165 having more cassettes 162, 176 for supplying unprocessed substrates to the loadlocks 160 and for accepting processed substrates from the loadlocks 160 using the robot 167. Certain embodiments of the present invention may include a heater within the loadlock. When using such embodiments, it may be possible to eliminate the heating chamber such as heating chamber 172 of FIGS. 16 and 17. In such a case an additional processing chamber 174 may be used if desired, and if only one loadlock 160 is used, the system will have seven processing chambers. Depending on the desired processing steps and the platform used, any number of processing chambers, loadlocks, and heating chambers may be used. Certain platforms may also utilize more than one transfer chamber.

Selected embodiments of the present invention can provide one or more of a number of advantages. For example, in certain embodiments, a single loadlock chamber can be used for both cooling processed substrates and heating unprocessed substrates. Various features also enable a large glass substrate to be cooled or heated quickly, thereby increasing the throughput of the system. Various aspects of the loadlock design may help to control the temperature of a substrate on the cooling plate to provide a more uniform temperature across the substrate or to provide a particular temperature distribution across the substrate. For example, the heating device 94 may in certain embodiments be used during a cooling operation in order to control the temperature distribution across a substrate. By controlling the insulative properties of the middle plate 56 and/or other portions of the loadlock, heat from the heating device 94 may be transmitted to a portion of a substrate in order to control its temperature. In one embodiment, by keeping the outer edges of the substrate at a higher temperature than the middle regions of the substrate, the outer edges can be placed into compression as the substrate cools, thus minimizing the risk of edge failures. Cooling the outer edges of a substrate at a slower rate than the interior portions of the substrate may be accomplished in certain embodiments by directed an amount of heat from the heating element 94 around the edges of the middle plate 56 to contact the outer edge regions of the processed substrate on the cooling plate 52.

In addition, the time spent waiting during processed substrate cooling and unloading from the loadlock can be significantly shorter when using a dual substrate cassette according to embodiments of the present invention, as compared to using a loadlock having a larger cassette holding, for example, 12 substrates. In a system having a cassette holding 12 substrates in the loadlock, it may take approximately 2 minutes for the system to vent and another 8 minutes to unload the substrates from the loadlock after it has been vented when using a robot arm to unload each substrate. Certain embodiments of the present invention (which have a considerably smaller interior chamber volume than a loadlock having a 12 substrate cassette therein) may preferably accomplish both the venting and removal of a processed substrate in a time of up to about a minute, or more preferably about 30 seconds. In addition, certain embodiments which have a heating element in the loadlock can heat a substrate quickly due to the relatively small interior volume in the loadlock and because the substrate can be located close to the heater. Preferred embodiments can heat the substrate in a time of less than one minute, or more preferably about 30 seconds.

The faster venting, substrate removal, and/or heating time provided by selected embodiments of the present invention offer several advantages. First, the throughput of the system may, for certain types of processing, be higher. Certain embodiments can permit a fast tact time, which is the time it takes one substrate to enter the system, be processed, and then exit the system. Second, the need to use a robot having the greatest speed possible (for unloading the substrates) may be reduced because the system can have less down time. Using a slower speed robot may improve the reliability of the processing system.

Depending on the processing steps to be carried out, it may in certain embodiments be desirable to have 0 or 1 substrate in the loadlock at any one time. In other embodiments, it may be desirable to have up to 2 substrates in the loadlock at any one time. Alternative embodiments may permit more than 2 substrates to be located in the loadlock at any one time. Selected embodiments of the present invention may achieve a high throughput despite having fewer substrates in the system at any one time than in certain other systems. For example, one batch processing system having a substrate cassette in the loadlock may at certain times have approximately 40 substrates in the system, with 12 substrates in the loadlock, 12 substrates in a heating chamber, and 16 substrates being processed in the other system chambers. Matching the number of substrates in the loadlock and heating chamber can permit smooth substrate transferring due to a symmetrical layout of the system. A system according to certain preferred embodiments of the present invention may at certain times have approximately 15 substrates in the system, with 1 in the loadlock, 8 in a heating chamber, and 6 substrates in the other system chambers. These numbers may vary considerably depending on the configuration of the various chambers in the system. Depending on the exact processing steps and their duration, due to the faster insertion and removal of substrates, certain embodiments of the present invention may have a higher overall throughput per time period than a system that having a 12-substrate cassette in the loadlock.

The smaller size of the loadlock dual substrate cassette of certain embodiments of the present invention relative to the loadlock cassettes used in some other systems also enables to loadlock to be fabricated from less material and to utilize smaller vacuum, elevator, power components and the like. These smaller components can make the system considerably less expensive than larger systems including multiple substrate cassettes within the loadlock.

Typical processing pressures used in the various chambers described above may range from about $10^{-8}$ Torr to several Torr and vary depending on the chamber and the process steps (PVD, CVD, etching, annealing, etc) being performed. It is generally desired that the pressure difference between adjacent chambers be kept to a minimum or controlled when adjacent chambers are in communication with each other in order to minimize contamination.

Embodiments of the present invention also include other types of processing systems such as linear systems in which a substrate may be transported from a loadlock to one or more processing chambers sequentially and then to the same or another loadlock, depending on the system layout.

It will, of course, be understood that modifications of the present invention, in its various aspects, will be apparent to those skilled in the art. A variety of additional embodiments are also possible, their specific designs depending upon the particular application. As such, the scope of the invention should not be limited by the particular embodiments herein described but should be defined by the claims.

What is claimed is:

1. A loadlock chamber, comprising:
 a chamber body having a first and second substrate access port;
 a first plurality of support pins movably disposed in the chamber body and arranged to support a first substrate thereon;
 a second plurality of support pins movably disposed in the chamber body and arranged to support a second substrate thereon; and
 a cooling plate disposed in the chamber body below the first plurality of support pins and stationary with respect to the chamber body.

2. A loadlock chamber, comprising:
 a chamber body having a first and a second substrate access port;
 a first plurality of support pins movably disposed in the chamber body and arranged to support a first substrate thereon;
 a second plurality of support pins movably disposed in the chamber body and arranged to support a second substrate thereon; and
 a cooling plate fixed to the chamber body at a position below the first plurality of support pins.

3. The loadlock chamber of claim 1, wherein the second plurality of support pins is configured to extend through the cooling plate.

4. The loadlock chamber of claim 3, further comprising an upper plate disposed within the chamber above the first plurality of support pins.

5. The loadlock chamber of claim 4, further comprising a middle plate disposed within the chamber between the first plurality of support pins and the second plurality of support pins.

6. The loadlock chamber of claim 5, further comprising a lower plate disposed within the chamber below the second plurality of support pins.

7. The loadlock chamber of claim 6, further comprising a cassette connecting the upper, middle, and lower plates.

8. The loadlock chamber of claim 7, further comprising an elevator to control the vertical position of the cassette.

9. The loadlock chamber of claim 2, wherein the cooling plate has a plurality of apertures formed therethrough.

10. The loadlock chamber of claim 9, wherein the first plurality of support pins are configured to extend through the apertures formed in the cooling plate.

11. The loadlock chamber of claim 10, wherein the cooling plate is attached to side walls of the chamber body.

12. The loadlock chamber of claim 11, further comprising:
 an upper plate disposed above the first plurality of support pins; and
 a cassette connecting the upper plate, the first plurality of support pins, and the second plurality of support pins.

13. The loadlock chamber of claim 12, further comprising an elevator to control the vertical position of the cassette.

* * * * *